United States Patent [19]

Konishi et al.

[11] 4,404,580
[45] Sep. 13, 1983

[54] LIGHT ACTIVATED SEMICONDUCTOR DEVICE

[75] Inventors: Nobutake Konishi; Masayoshi Naito; Tsutomu Yatsuo; Yoshio Terasawa, all of Ibaraki, Japan

[73] Assignee: Hitachi, Ltd., Tokyo, Japan

[21] Appl. No.: 172,072

[22] Filed: Jul. 24, 1980

[30] Foreign Application Priority Data

Aug. 1, 1979 [JP] Japan .................................. 54-97339

[51] Int. Cl.³ ..................... H01L 29/74; H01L 29/14; H01L 29/12
[52] U.S. Cl. ........................................ 357/38; 357/30; 357/58; 357/90
[58] Field of Search ................ 357/38 LA, 90, 20, 30, 357/58, 46

[56] References Cited

U.S. PATENT DOCUMENTS 3,893,153  7/1975  Page et al. ..................... 357/38 OR
3,945,028  3/1976  Krishna et al. ................... 357/58 X

*Primary Examiner*—James W. Davie
*Assistant Examiner*—J. Carroll
*Attorney, Agent, or Firm*—Antonelli, Terry & Wands

[57] ABSTRACT

A light activated thyristor with high dv/dt capability is provided by disposing first and second thyristors, one a primary and the other a pilot thyristor, in a semiconductor body having first and second major surface. The two thyristors have common first emitter, first base, and second base regions, and have spaced apart second emitter regions adjoining the second major surface of the body. The second emitter region of the second thyristor consists of first and second portions, first portion abutting the second base region of the second thyristor to create a ratarded electrical field. An exposed portion of the second major surface at the second emitter region of the second thyristor activates the second thyristor when electromagnetic radiation of wavelengths corresponding substantially to the energy bandgap of the semiconductor body strikes this exposed portion. The cathode electrode makes ohmic contact with the second emitter region of the first thyristor, and the anode electrode makes ohmic contact with the common first emitter regions. A floating contact also makes ohmic contact to the second emitter region of the second thyristor and the common second base region between the thyristors.

11 Claims, 17 Drawing Figures

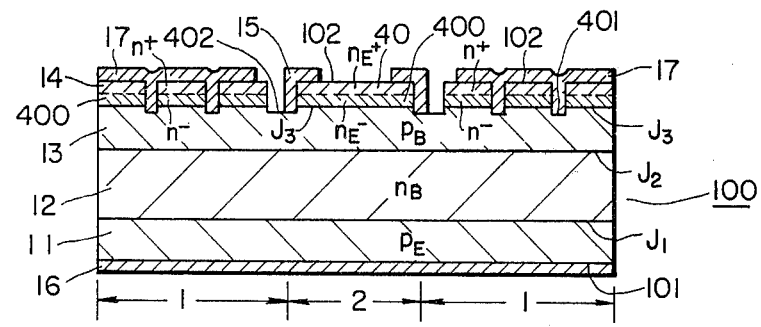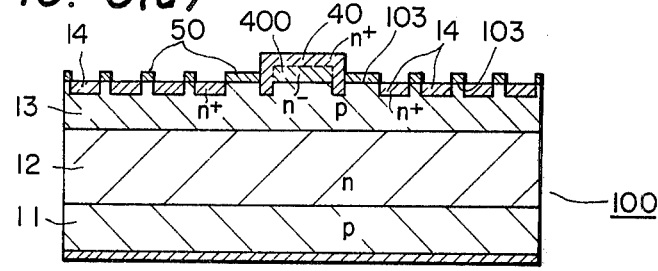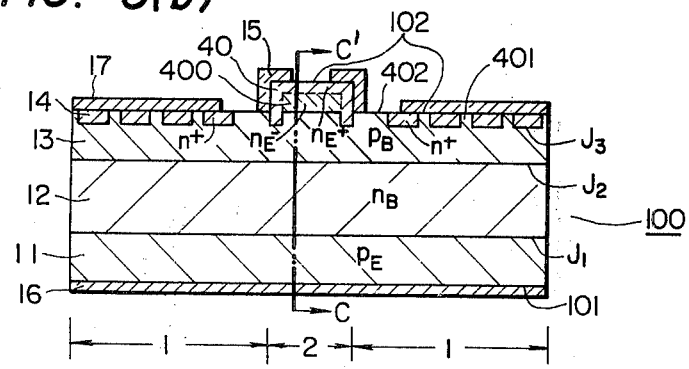

LIGHT ACTIVATED SEMICONDUCTOR DEVICE

BACKGROUND OF THE INVENTION

This invention relates to a light activated semiconductor device, and more particularly to a light activated thyristor which has a high dv/dt capability.

A light activated thyristor which has the function of switching from the forward blocked state into the conductive state by being irradiated with light is constructed of at least four layers of p-n-p-n, a pair of main electrodes lying in ohmic contact with both the outer layers of the four layers, and a portion to be irradiated with light to serve as a trigger. As compared with an electrically-gated thyristor, the light activated thyristor has such advantages (1) that since a main circuit and a gate circuit can be electrically isolated, and the gate circuit can be simplified, and (2) that it is immune to noise due to electromagnetic induction. Therefore, the development of light activated thyristors for high voltage which can demonstrate these advantages best has been proceeding at a rapid rate recently.

A light activated semiconductor device of the type described above is disclosed in U.S. Pat. No. 3,893,153. As one of problems in this device, it is mentioned that the more the dV/dt capability is raised, the more the light ignition sensitivity deteriorates. That is, the dV/dt capability and the light ignition sensitivity are mutually contradictory requirements.

SUMMARY OF THE INVENTION

An object of this invention is to provide a light activated semiconductor device which can enhance the dV/dt capability without sacrificing the light sensitivity. This object is equivalent to enhancing the light sensitivity without sacrificing the dv/dt capability.

To accomplish this object, the first feature of this invention consists in that a semiconductor body in which four p-n-p-n layers are stacked in the order mentioned has a low density semiconductor layer introduced between one layer on the side of cathode electrode thereof and one inner layer thereof adjoining the outer layer and that the impurity density of the low density semiconductor layer is made lower than the maximum value of the impurity density of the one inner layer in a part adjoining the one inner layer.

A second feature of the invention consists in that light is irradiated from the exposed surface of the one outer layer on the side of cathode electrode of the aforecited 4-layered structure.

By adopting such a construction as will mentioned afterwards, when a voltage of great dv/dt value is applied in the forward blocked state, carriers to be injected from the high density part of the one outer layer on the side of cathode electrode into the one inner layer are limited by the low density semiconductor layer, and the dv/dt capability is enhanced. In addition, the quantity of electron-hole pairs to be excited within the semiconductor by the irradiation of the light signal is not appreciably affected by the existence of the low density semiconductor layer stated above, so that the lowering of the light sensitivity mentioned is not previously a problem.

DRAWING

FIG. 1 is a sectional view of a light activated thyristor which shows an embodiment of this invention.

FIGS. 2(a)-(d) shows the outline of a manufacturing process of this invention shown in FIG. 1.

FIGS. 5, 7, 8(a) and 8(b) are sectional views of the thyristor which show other embodiments of this invention.

Figure 5:
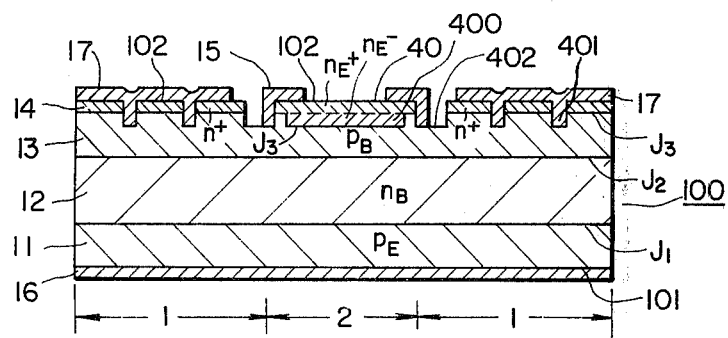

FIGS. 6(a)-(f) show the outline of a manufacturing process of this invention shown in FIG. 5.

DETAILED DESCRIPTION OF THE PREFERRED EMBODIMENTS

Figure 1:
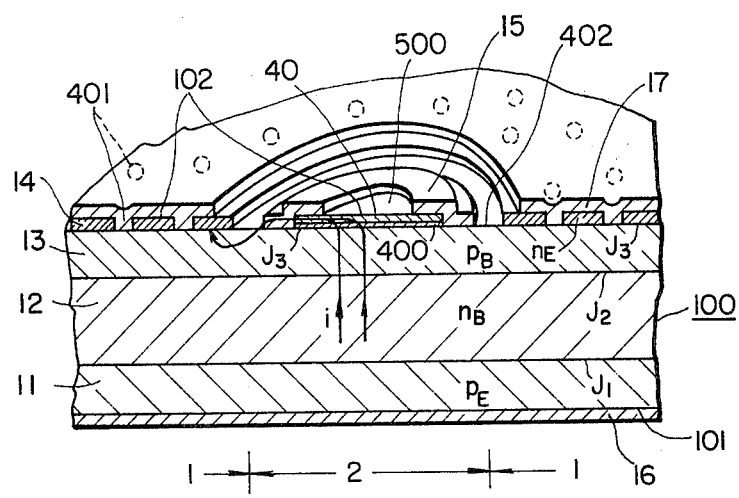

Referring to FIG. 1, semiconductor body 100 is provided for forming the thyristor of the present invention therein. The body 100 has disposed therein first thyristor 1 and second thyristor 2 in parallel arrangement, thyristor 1 being the primary or load thyristor and thyristor 2 being the pilot or activating thyristor.

Each thyristor has four impurity regions of alternate carrier-type disposed alternately through semiconductor body 100 between the major surfaces 101 and 102. The first or primary thyristor 1 has a first impurity region $P_E$ of P-type conductivity in body 100 adjoining first major surface 101 to form first emitter region 11, a second impurity region $n_B$ of n-type conductivity adjoining the first inpurity region $P_E$ in interior portions of body 100 to form first base region 12, a third impurity region $P_B$ of P-type conductivity adjoining the second impurity region $n_B$ of interior portions of body 100 to form second base region 13, and a fourth impurity region adjoining the third impurity region $P_B$ in interior portion of body 100 and adjoining second major surface 102 to form second emitter region 14.

Impurity regions 11, 12 and 13 extend through semiconductor body 100 and thus provide common first emitter, first base and second base regions for second thyristor 2. A fifth impurity region is provided adjoining second major surface 102 apart from second emitter region 14 to form second emitter region of second thyristor 2. This second emitter region of second thyristor 2 has a first portion $n_E^-$ of n$^-$-type conductivity in body 100 adjoining second base 13 to form second emitter region 400, and a second portion $n_E^+$ n$^+$ type conductivity in body 100 adjoining the first portion $n_E^-$ and second major surface 102 to form second emitter region 40.

Common second base region 13 also adjoins the second major surface intermittently through spaces in the second emitter region 14 of first thyristor 1 to form shunts 401.

By the diffusion of second emitter region 14, shunts 401 may be formed intermittently where second base region 13 remains adjoining second base region 13 is formed between second emitter region 14 and second emitter region 40, 400 of first and second thyristors, where second base region 13 remains adjoining major surface 102.

Anode electrode 16 is disposed on the first major surface 101, and make ohmic contact with the common first emitter region 11 of both thyristors 1 and 2.

Cathode electrode 17 is disposed on second major surface 102, and make ohmic contact with the second emitter region 14 of the first thyristor 1. The cathode electrode 17 also makes ohmic contact with the second base region 13 of the first thyristor 1 at the shunts 401 therethrough.

To complete the thyristor assembly, floating contact 15 is also positioned on the second surface 102 of the second thyristor astride at least portion of the intermediate portion 402. Floating contact 15 thus makes ohmic contact with both common second base region 13 between thyristors 1 and 2 and second emitter region 40, 400 of second thyristor 2, while leaving exposed a substantial portion of the second major surface 102 adjoining second emitter region 40.

Referring to FIG. 2, a thyristor of the first embodiment of this invention is shown by vertical sectional views of respective fabricating steps therefor.

Figure 3:
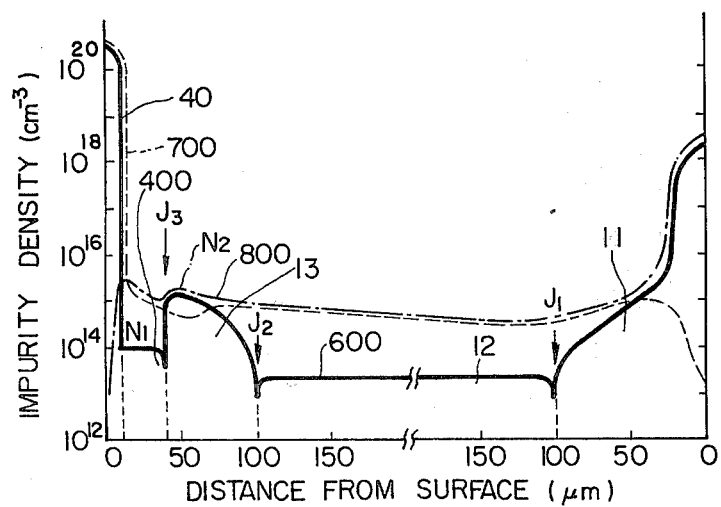
FIG. 3 is a graph showing an impurity density profile taken along line C-C' in FIG. 2 (d).
Figure 2A:
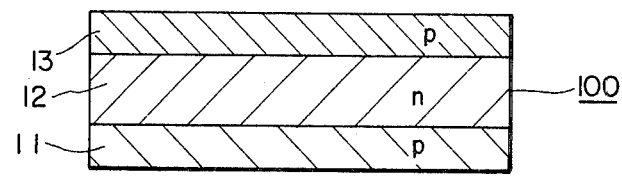
Figure 2B:
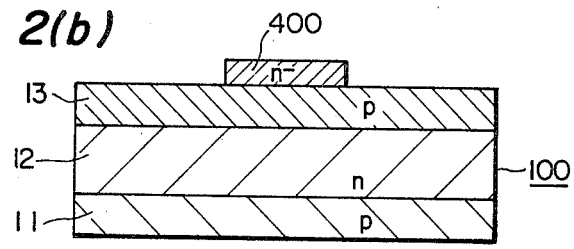
Figure 2C:
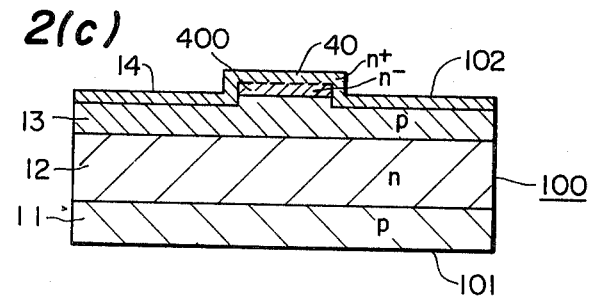
Figure 2D:
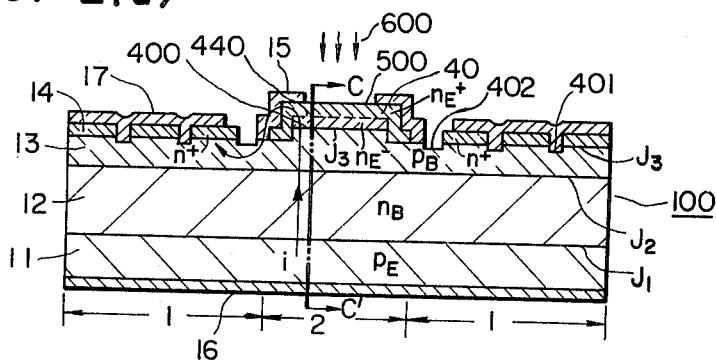

First, aluminium which is a p-type dopant is diffused into both the major surfaces of an n-type silicon substrate 100 having a resistivity of 250 Ωcm, to form a p-type emitter layer 11 and a p-type base layer 13, the remaining part of the silicon substrate 100 becoming an n-type base layer 12(a). Subsequently, an n-type layer 400 is formed by the use of the epitaxial growth technique. The epitaxial growth may be selectively carried out as shown in FIG. 2(b), or alternatively, after performing the epitaxial growth over the whole exposed surface of the p-type base layer 13, the n-type layer 400 as shown in FIG. 2(b) may be left by the etching technique (b). At the next step, phosphorus which is an n-type dopant is diffused into the whole areas of the exposed major surface of the p-type base layer 13 and the exposed surface of the n-type layer 400, to form an n-type emitter layer 14(c). Subsequently, an annular groove 402 which gets to the p-type base layer 13 is formed to isolate the second thyristor region 2 and the first thyristor region 1, and a large number of short-circuit apertures 401 are similarly formed. An anode electrode 16, a cathode electrode 17 and a floating contact 15 are formed by the use of aluminium or the like. The floating contact 15 short-circuits an $n_E{}^+$ emitter layer 40 and the p-type base layer 13 at the outer periphery of the n-type emitter layer 40, and simultaneously forms an opening 500 through which light is irradiated (d). The impurity density profile in direction C - C' of the light activated thyristor shown in FIG. 2(d) is represented by FIG. 3. In FIG. 3, it is clear that the impurity density $N_1$ of the $n^{--}$-type emitter layer 400 is lower than the maximum density $N_2$ of the p-type base layer 13. It is understood that the values of FIG. 3 are for one example only, and that values for such impurity concentrations can be set at other values falling within the ranges set forth hereinafter.

The body 100 shows a uniform impurity concentration which decreases at each surface because of the diffusion process producing regions 11 and 13. Region 11 has an impurity profile which shows an increasing impurity concentration from $10^{14}$ to $10^{20}$ atoms per cubic centimeter and a thickness of from 50 to 200 microns. The impurity profile for the region 13 has a maximum less than the larger impurity densities of region 11.

Region 13 has an impurity profile which shows an increasing impurity concentration from $10^{13}$ to $10^{17}$ atoms per cubic centimeter and a thickness of from 50 to 130 microns. Region 12 has an impurity profile which shows a uniform impurity concentration from $10^{13}$ to $10^{14}$ atoms per cubic centimeter and a thickness of from 500 to 1200 microns. Region 400, or first portion, has an impurity profile which shows approximately a uniform impurity concentration $10^{14}$ atoms per cubic centimeter and a thickness of from 10 to 30 microns. Region 40, or second portion, has an impurity profile which shows an increasing impurity concentration from $10^{13}$ to $10^{21}$ atoms per cubic centimeter and a thickness of from 5 to 12 microns.

The region 13 with its initial increasing impurity concentration retards the flow of the electrons through the region 13 and into the region 12.

When the light activated thyristor 100 of the present invention is in the forward blocked state, the carrier density of $n^{--}$-type second emitter layer 400 at a p-n junction $J_3$ is less than that of the p-type second base layer 13. Therefore, regarding current which passes through the p-n junction $J_3$, a hole current predominates while the current value is small, so that the quantity of electrons which are injected from the n-type second emitter layers 400 and 40 into the p-type second base layer 13 through the p-n junction $J_3$ is small.

For this reason, even when a forward voltage of great dv/dt is applied across the cathode electrode 17 and the anode electrode 16, a small amount of electrons are injected from the n-type second emitter layers 400 and 40 into the p-type second base layer 13. Accordingly, the disadvantage that the thyristor shown in the prior art as such in U.S. Pat. No. 3,893,153 is erroneously turned "on" electrons injected from the n-type second emitter layer 40 into the p-type second base layer 13 by a forward voltage of great dv/dt capability is improved.

In order to turn "on" the thyristor of the present embodiment from under the forward blocked state, under the state under which a negative voltage with respect to the anode electrode 16 is applied to the cathode electrode 17 as well as the floating contact 15, light having energy above 1.1 eV being the bandgap energy of silicon (below 1.15 μm in terms of the wavelength), for example, light 600 of a gallium arsenide light emitting diode (GaAs LED) having a wavelength of 0.9 μm is irradiated through the opening 500 of the floating contact 15. By irradiating the light, electron-hole pairs appear within the n-type second emitter layer 400, the p-type second base layer 13 and the n-type base layer 12. Therefore, the n-type second emitter layer 400 is filled up with carriers by holes injected from the p-type second base layer 13 into the n-type emitter layer 400, electrons injected from the n-type second emitter layer 40 into the n-type second emitter layer 400 and the electron-hole pairs generated within the n-type emitter layer 400 by the light projection. Consequently, the difference of carrier densities becomes small between the side of the n-type second emitter layer 400 and the side of the p-type base layer 13 of the p-n junction $J_3$, and a potential barrier at the p-n junction $J_3$ becomes below the extent of thermal energy and substantially disappears. This thermal energy is approximately 35 mV at 125° C. and 26 mV at 27° C. and so on.

For this reason, the n-type second emitter layer 400 substantially becomes a base region continuous to the p-type second base layer 13. At this time, the substantial p-n junction $J_3$ becomes the boundary 440 between the n-type emitter layer 40 and the n-type emitter layer 400. Since the electron density of the n-type second emitter layer 40 is sufficiently high, electrons are sufficiently injected from here into the base region, so that the second thyristor region 2, or the auxiliary thyristor region 2 is turned "on". As a result, the main current i of the second thyristor region 2 flows as indicated by arrow in the figure. Thereafter, as in conventional amplification gate type thyristors, the current is injected into the n-type second emitter layer 14 of the first thyristor region 1, or the main thyristor region, through the floating contact 15 and the p-type second base layer 13 and promotes the injection of electrons from the n-type second emitter layer 14 to bring the main thyristor into turn-on.

The effect of the present embodiment will be explained hereunder. Using the GaAs LED as the light source, a light signal at the wavelength of 0.9 μm was applied to the light activated thyristor shown in FIG. 2(d) and the prior-art example shown in U.S. Pat. No. 3,893,153. The light signal is a light beam having a diameter of about 1 mm, and a light irradiation part (the exposed surface of the n-type second emitter layer 40) have a diameter of 6 mm.

As a result, the present embodiment is turned "on" by conducting a current of 50 mA through the GaAs LED, while the prior-art example is turned "on" by conducting a current of 40 mA. The dv/dt capability is about 4,000 V/sec in the present embodiment, whereas it is about 1,000 V/sec in the prior-art example. The light emission output of the GaAs LED is substantially proportional to the quantity of conducted current, so that in comparison with the prior-art example, the present embodiment have the dv/dt capability enhanced to four times but have the light sensitivity lowered to about 0.8 times only. That is, in the present embodiment, the dv/dt capability could be greatly enhanced without lowering the light sensitivity to the extent of incurring a problem in practice.

In accordance with this invention, the light sensitivity can be raised without worsening the dv/dt capability. The light sensitivity of a light activated thyristor of the type which has a 4-layered p-n-p-n structure and in which a light is irradiated from one outer layer varies depending upon the ratio between the area of the one outer layer and the area of the light irradiated on the exposed major surface of the one outer layer, and if the light signal is fixed, the light sensitivity will become higher as the area of the one capability decreases more as the area of the one outer layer is larger. It has therefore been subject to limitation to enhance the light sensitivity without worsening the dv/dt capability. In contrast, according to the invention, as already explained, the dv/dt capability can be enhanced without sacrificing the light sensitivity. Accordingly, the light sensitivity can be enhanced without worsening the dv/dt capability by adopting the structure according to this invention and increasing the area of the one outer layer illuminated with the light.

Following is the explanation of the present invention in the state of conduction. With reference to FIG. 3, the carrier density in the state of conduction is denoted therein. In FIG. 3, the solid line 600, the dotted line 700, and the broken line 800 denote the impurity density, the electron density, and the hole density of each conductive type layer 11, 12, 13, 400, and 40, respectively. As shown in FIG. 3, the n⁻-type second emitter layer 400 is filled with the carrier approximately equal to that of the maximum value of the impurity density of the p-type second base layer 13. Therefore, as already explained, the difference of carrier densities becomes small between the side of the n-type second emitter layer 400 and the side of the p-type base layer 13 of the p-n junction $J_3$, so that the conduction state is maintained easily. Also, the voltage drop of the body 100 in the state of conduction can be suppressed to the degree of not interferring with the practical use.

Figure 4:
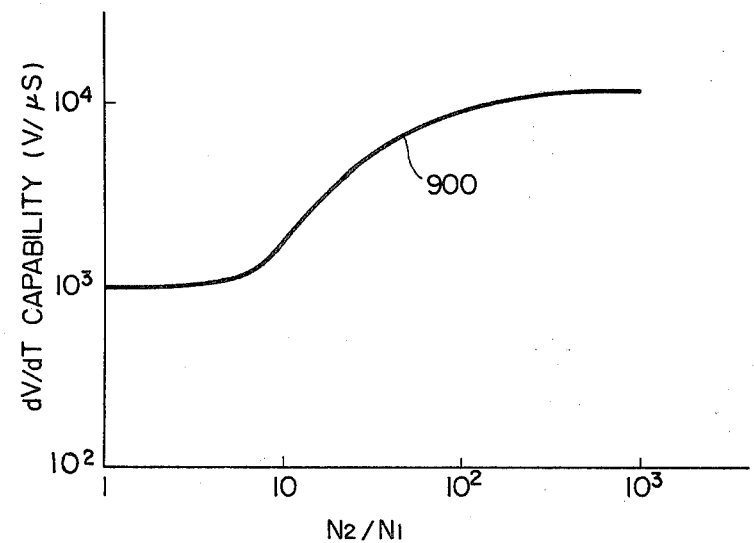
FIG. 4 is a graph showing the relationship between $N_2/N_1$ which denotes the ratio of the maximum value $N_2$ of impurity density of the second base layer $P_B$ to the impurity density $N_1$ of the N$^-$ type first portion and the dV/dt capability of the thyristor shown in FIG. 2(d).

Following is the explanation between the impurity density $N_1$ of the n⁻-type first portion 400 and the maximum impurity density $N_2$ of the p-type second base region 13. When $N_2/N_1$, or the ratio of the maximum value $N_2$ to the $N_1$, is changed in the region of from 1 to $10^3$, the dv/dt capability (V/μs) is measured as shown in 900 of FIG. 4. According to FIG. 4, it is obvious that the dv/dt capability of the present invention shown in FIGS. 1 and 2 in the region of from 2 to 10 is about the same as that of the thyristor shown in the prior art, but in the region of from 10 to $10^3$, the dv/dt capability of the present invention is largely improved as shown in FIG. 4.

By making the ratio $N_2/N_1$ more than 10, the dv/dt capability is improved largely. The upper limit of $N_2/N_1$ is limited to $10^4$ approximately, because the difference of the maximum impurity density between two layers which consist of p-type conductive layer and n-type conductive layer cannot presently be made larger on account of present manufacturing limitations in making thyristors.

Now, another embodiment of this invention will be described. A light activated thyristor shown in FIG. 5 differs from that shown in FIGS. 1 and 2 in that both the exposed major surfaces 102 of the second n-type emitter layer 40 of the second thyristor region 2 and the first thyristor region 1 lie within an identical plane. Such structure is obtained in such a way as shown in FIG. 6 that the second n-type emitter layer 400 is formed on the second p-type base layer 13 in a manner to fill up a recess 400 formed in a predetermined part of the latter layer 13 in advance (b), (c), and that after polishing the surface (d), the second n-type emitter layer 40 is formed into the exposed major surfaces of the second n-type emitter layer 400 and the p-type second base layer 13 by the diffusion process (e). The other steps (a) and (f) are the same as those illustrated in FIG. 2.

Figure 6A:
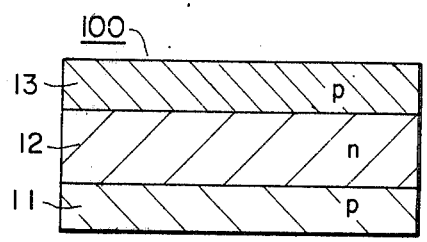
Figure 6B:
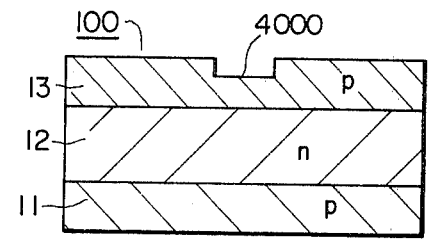
Figure 6C:
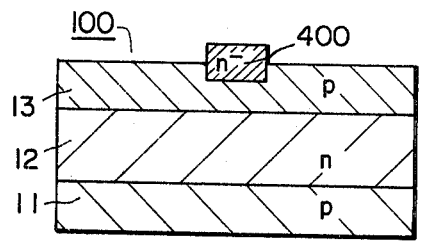
Figure 6D:
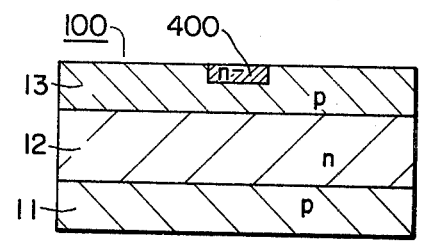
Figure 6E:
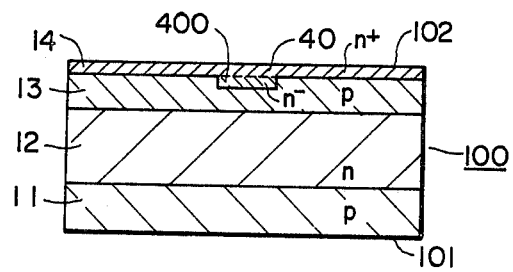
Figure 6F:
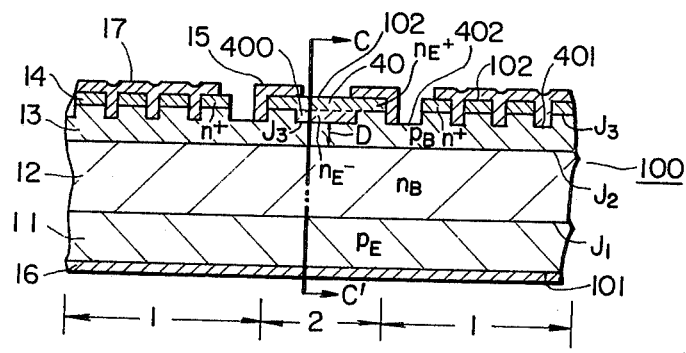

Such construction brings forth the effect that the light sensitivity is highly improved because the thickness D shown in FIG. 6(f) between the junction $J_2$ and the junction $J_3$ of the first portion 400 become thin, and the photoetching for forming the annular groove 402 and the short-circuit apertures 401 can be carried out at high precision because the exposed major surfaces 102 of the n⁺-type second emitter layer 14 lie within an identical plane.

A light-activated thyristor shown in FIG. 7 differs from that shown in FIGS. 1 and 2 in the an n⁻-type second emitter layer 400 is also arranged in the first thyristor region 1. Such structure is obtained in such a way that the n⁻-type second emitter layer 400 is formed on the whole area of the exposed major surface of the p-type second base layer 13 by the epitaxial growth process and that the n-type second emitter layer 40 is formed into the exposed major surface of the n⁻-type second emitter layer 400 by the diffusion process or onto the n⁻-type second emitter layer 400 by the epitaxial growth process. The other steps are the same as those illustrated in FIG. 2. According to such construction, besides the effect owing to the structure shown in FIG. 5, the step for forming the n⁻-type emitter layer 400 in the selected area of the p-type base layer 13 is omitted to simplify the manufacturing process.

In the embodiments shown in FIGS. 2 and 5, the n-type second emitter layer 40 and the p-type second base layer 13 have been short-circuited, whereas in the embodiment shown in FIG. 7, the n⁻-type second emitter layer 400 and the p-type second base layer 13 have been short-circuited. However, a significant difference in performance was not noted.

In the embodiments shown in FIGS. 2 and 5, the method of short-circuiting the n-type second emitter layer 40 and the p-type second base layer 13 may well be such that, without providing the short-circuit apertures 401, the n-type second emitter layer 40 is formed in selected areas of the surface of the p-type second base layer 13 by the diffusion process, both the layers 40 and 14 being short-circuited by a flat cathode electrode 17.

FIG. 8 shows the above mentioned embodiment. In FIG. 8(a), n⁻-type second emitter layer 400 is formed in manner similar to that shown in FIG. 2(b). After the formation of $SiO_2$ on the exposed surface 103 of the second base region 13 by the process of thermal oxidation or chemical vapour deposition, the $SiO_2$ layer attached to the place where the n⁺-type second emitter layer 14 and 40 should be formed is removed by photoetching process, and then phosphorus which is an n-type dopant is diffused into the place. As shown in FIG. 8(b), after the remained $SiO_2$ layer 50 on the surface 102 is cleared, an anode electrode 16, a cathode electrode 17 and a floating contact 15 are formed by using aluminum or the like.

As set forth above, this invention is effective in that the dv/dt capability (light sensitivity) of a light activated thyristor is enhanced without sacrificing the light sensitivity (dv/dt capability) thereof.

We claim:

1. In a light activated semiconductor device comprising:
   (1) first and second semiconductor devices disposed in a semiconductor body having first and second major surfaces; each said device having four impurity regions formed as adjoining layers in said body between said major surfaces, with adjacent impurity regions being of alternate carrier types to form PN junctions between said adjacent regions so that for each device an impurity region adjoining said first major surface forms a first emitter, an impurity region adjoining said second major surface forms a second emitter and the two impurity regions between said first and second emitters form first and second base regions with the first base region adjoining the first emitter and the second base region adjoining the second emitter, respectively;
   (2) said second base, first base and first emitter regions of said first and second devices being common to both devices;
   (3) said common second base region adjoining portions of said second major surface of said first device, and said second emitter regions of said first and second devices being spaced from each other;
   (4) wherein an exposed portion of said second major surface, adjoining said second emitter region of said second device, activates said second device when electromagnetic radiation of wavelengths corresponding substantially to a bandgap energy of a semiconductor material of said body strikes said exposed portion of said second major surface;
   (5) cathode and anode electrodes disposed on portions of said second and first major surfaces, respectively, of said semiconductor body to make ohmic contact with said second emitter region of said first device and a common first emitter region of both devices;
   (6) a floating contact positioned on a portion of said second major surface to make ohmic contact with said common second base region between said devices and said second emitter region of said second device, while leaving exposed for light activation said exposed portion of said second major surface adjoining said second emitter region of said second device; the improvement further comprising:
      (a) said second emitter of said second device comprising first and second portions, said first portion abutting said second base region so that a p-n junction is formed therebetween,
      (b) said first base region having an impurity density lower than that of said first emitter region, said second base region having an impurity density higher than that of said first base region, said first portion of said second emitter of said second device having an impurity density lower than a maximum value of an impurity density of said second base region, and said second portion of said second emitter region of said second device having an impurity density higher than said first portion, and
      (c) a maximum value of said impurity density of said second base region being at least 10 times greater than the impurity density of said first portion.

2. A light activated semiconductor device according to claim 1, in which a maximum value of the impurity density of said second base is from 10 to 1000 times that of said first portion.

3. A light activated semiconductor device according to claim 1, in which said first portion has a level of impurity density which increases with increasing distance from the p-n junction formed in between said second base and said first portion.

4. A light activated semiconductor device according to claim 1, in which
   (a) said first emitter has a concentration from $10^{14}$ to $10^{20}$ atoms per cubic centimeter and a thickness of from 50 to 200 microns;
   (b) said first base has a concentration from $10^{13}$ to $10^{14}$ atoms per cubic centimeter and a thickness of from 500 to 1200 microns;
   (c) said second base has a concentration from $10^{13}$ to $10^{17}$ atoms per cubic centimeter and a thickness of from 50 to 130 microns;
   (d) said first portion has a concentration $10^{13}$ atoms per cubic centimeter and a thickness of from 10 to 30 microns; and
   (e) said second portion has a concentration from $10^{13}$ to $10^{21}$ atoms per cubic centimeter and a thickness of from 5 to 12 microns.

5. A light activated semiconductor device according to claim 1, in which both exposed major surfaces of said second emitters layers of said first and second semiconductor devices lie within an identical plane.

6. A light activated semiconductor device according to claim 1, wherein said first portion has a uniform impurity density and said second portion has a graded impurity density.

7. A light activated semiconductor device according to claim 1, in which said cathode electrode also makes ohmic contact with said second base region at shunts through said cathode emitter region of said first device.

8. In a light activated semiconductor device comprising:

(1) a semiconductor device disposed in a semiconductor body having first and second major surfaces; said device having four impurity regions formed as layers between said major surfaces, with adjacent impurity regions being of alternate carrier types to form PN junctions between said adjacent regions so that an impurity region adjoining said first major surface forms a first emitter, and an impurity region adjoining said second major surface forms a second emitter and the two impurity regions between said first and second emitter form first and second base regions with the first base region adjoining the first emitter and the second base region adjoining the second emitter and another portion of the second major surface respectively;

(2) wherein an exposed portion of said second surface adjoining said second emitter region of said device activates said device when electromagnetic radiation of wavelengths corresponding substantially to a bandgap energy of a semiconductor material of said body strikes said exposed portion of said second major surface;

(3) an anode electrode disposed on a portion of said first major surface of said semiconductor body and making ohmic contact with said first emitter region of said device;

(4) a cathode electrode positioned on portion of said second major surface to make ohmic contact to said second emitter region and said portion of said second major surface to make ohmic contact with said second base region between said second base region and said second emitter region of said device, while leaving exposed for light activation said exposed portion of said second major surface adjoining said second emitter region of said device; the improvement further comprising:

(a) said second emitter of said device comprising first and second portions, said first portion abutting said second base region so that a p-n junction is formed therebetween, (b) said first base region having an impurity density lower than that of said first emitter region, said second base region having an impurity density higher than that of said first base region, said first portion of said second emitter having an impurity density lower than a maximum value of an impurity density of said second base region, and said second portion of said second emitter having an impurity density higher than said first portion, and (c) a maximum value of said impurity density of said second base region being at least 10 times greater than that of said first portion.

9. A light activated semiconductor device according to claim 8, in which a maximum value of the impurity density of said second base is from 10 to 1000 times that of said first portion.

10. A light activated semiconductor device according to claim 8, wherein said first portion has a uniform impurity density and said second portion has a graded impurity density.

11. A light activated semiconductor device according to claim 8, in which (a) said first emitter has a concentration from $10^{14}$ to $10^{20}$ atoms per cubic centimeter and a thickness of from 50 to 200 microns;

(b) said first base has a concentration from $10^{13}$ to $10^{14}$ atoms per cubic centimeter and a thickness of from 500 to 1200 microns;

(c) said second base has a concentration from $10^{13}$ to $10^{17}$ atoms per cubic centimeter and a thickness of from 50 to 130 microns;

(d) said first portion has a concentration $10^{13}$ atoms per cubic centimeter and a thickness of from 10 to 30 microns; and (e) said second portion has a concentration from $10^{13}$ to $10^{21}$ atoms per cubic centimeter and a thickness of from 5 to 12 microns.

* * * * *